United States Patent
Nakayama

[11] Patent Number: 5,838,626
[45] Date of Patent: Nov. 17, 1998

[54] NON-VOLATILE MEMORY

[75] Inventor: Sadao Nakayama, Tokyo, Japan

[73] Assignee: NEC Corporation, Tokyo, Japan

[21] Appl. No.: 908,708

[22] Filed: Aug. 8, 1997

[30] Foreign Application Priority Data

Aug. 9, 1996 [JP] Japan .................................. 8-210785

[51] Int. Cl.$^6$ ..................................... G11C 13/00

[52] U.S. Cl. ..................................... 365/226; 365/189.09

[58] Field of Search .................................. 365/226, 227, 365/189.09

[56] References Cited

PUBLICATIONS

Wada, Takeshi "Development Stage and Application of Flash Memory in Hitachi", technical paper delivered at a seminar in Japan on Mar. 3, 1992.

*Primary Examiner*—Terrell W. Fears
*Attorney, Agent, or Firm*—Foley & Lardner

[57] ABSTRACT

A non-volatile memory includes a plurality of cell blocks, each including a plurality of non-volatile memory cells which are electrically rewritable. Each non-volatile memory cell has a source, a drain, a control gate and a floating gate. The non-volatile memory is further provided with a bias controller which can concurrently apply a first bias voltage to the source and a second bias voltage to the drain of each non-volatile memory cell In call blocks. Preferably, the bias controller applies the first bias voltage to both the source and the drain of each non-volatile memory cell.

13 Claims, 7 Drawing Sheets

NON-VOLATILE MEMORY

BACKGROUND OF THE INVENTION

1. Field of the Invention

The present invention generally relates to a non-volatile semiconductor memory having a plurality of cell array blocks.

2. Description of the Related Art

In a non-volatile memory such as a flash memory which is capable of electrically erasing and rewriting data in cell array blocks, a write disturbance is an important problem in reliably retaining data. To overcome this problem, a source bias method has been proposed in a technical paper "Development stage and Applications of flash memory in Hitachi" written by Takeshi Wada who is a member of IC design division of Semiconductor design and development center in Hitachi Ltd. The details will be described hereinafter.

Referring to FIG. 1, which includes a memory circuit diagram as described in paragraph 3.4 of the above technical paper, an array of memory cells M1–M8 are divided into a first block BLOCK0 of M1, M2, M5 and M6 and a second block BLOCK1 of M3, M4, M7 and M8. The control gates of the memory cells M1–M4 are connected to a word line WORD0 and those of the memory cells M5–M8 to another word line WORD1. In the case where the memory cell M1 is selected for data write, a high voltage (here, 12V) is applied to the word line WORD0, a ground voltage is applied to the word line WORD1, a data voltage of 6V is applied to the drains of the memory call M1 and M5, and further the ground voltage is applied to the source line SOURCE0 for the memory cells M1 and M5.

In the second block BLOCK1, the high voltage (12V) is also applied to the control gates of the memory cells M3 and M4 which are hereinafter called disturbed cells. However, according to the source bias method, a source bias voltage $V_{BIAS}$ is applied to the source line SOURCE1 so as to reduce the strength of electric field between the control gate and the source in the memory cells M3 and M4. This improves the data retaining characteristic of those memory cells.

On the other hand, the source bias voltage $V_{BIAS}$ is also applied to the source of the memory cells M7 and M8 whose control gates are set to the ground voltage (therefore, these cells are called hereinafter non-disturbed cells). In the memory cell M8, for example, the source bias voltage $V_{BIAS}$ is applied to its source S, the ground voltage to its control gate CG, and its drain D is open. Such a bias state generates an electric field from the source to the control gate, which causes the stored charges of the floating gate to tunnel through the gate insulating film. In other words, this bias state is an erasing mode and such an erasing is referred to as soft-erasing. Therefore, the source bias voltage $V_{BIAS}$ has to be optimally determined taking into account both the write-disturbance reduction and the soft-erasing. To determine the source bias voltage $V_{BIAS}$, a soft-erasing test is needed.

According to the conventional memory, since the soft-erasing occurs in the bias state of the erasing mode as described above, the soft-erasing test of the Flash memory is performed using the erasing mode.

SUMMARY OF THE INVENTION

The inventor, however, found that using the erasing mode is not an optimal method which can sufficiently replicate the soft-erasing. As shown in FIG. 1, when the WORD0 is selected, the disturbed memory cell M4 is forced into conduction. Therefore, the source bias voltage $V_{BIAS}$ is also applied to the drain D of the non-disturbed memory cell M8 through the disturbed memory cell M4. More specifically, in the case of the non-disturbed memory cell M8 being in the soft-erasing state, actually the source bias voltage $V_{BIAS}$ is applied to both the source and drain of the cell M8 as shown in the following table.

TABLE

|  | Control gate voltage | Drain voltage | Source voltage |
|---|---|---|---|
| Erasing mode | 0 V | open | 12 V |
| Soft-erasing | 0 V | $V_{BIAS}$ | $V_{BIAS}$ |

Therefore, an electric field is not only generated between the control gate CG and the source S but also between the control gate CG and the drain D, resulting in stored charges in the floating gate tunneling into both the source S and the drain D. In other words, actual soft-erasing cannot be precisely duplicated by the erasing mode in which the source bias voltage $V_{BIAS}$ is applied to the source S with the drain D open. This means that an accurate source bias voltage $V_{BIAS}$ cannot be obtained by the conventional soft-erasing test.

Further, in the conventional non-volatile memory as shown in FIG. 1, the write-disturbance reduction is achieved when the disturbed cell is forced into conduction because the respective voltages of the source and drain increase to the source bias voltage. However, there may be cases where the memory cell is not forced into conduction due to its threshold voltage. In this case, sufficient write-disturbance reduction cannot be achieved.

An object of the present invention is to provide a non-volatile memory and a control method therefor which can retain data with stability and reliability.

Another object of the present invention is to provide a non-volatile memory and a control method therefor which can achieve precise soft-erasing test and sufficient write-disturbance reduction.

According to the present invention, a non-volatile memory includes a plurality of cell blocks, each of which is comprised of a plurality of non-volatile memory cells which are electrically rewritable. Each non-volatile memory cell has a source, a drain, a control gate and a floating gate. The non-volatile memory is further provided with a bias controller which can concurrently apply a first bias voltage to the source and a second bias voltage to the drain of each non-volatile memory cell in cell blocks. Preferably, the bias controller concurrently applies the first bias voltage to both the source and the drain of each non-volatile memory cell.

Since the first and second bids voltages are applied to the source and the drain of each non-volatile memory cell, respectively, the soft-erasing test is performed in the close-to-actual state that an electric field is generated not only between the control gate and the source but also between the control gate and the drain. Therefore, actual soft-erasing can be precisely duplicated and thereby an optimal source bias voltage can be obtained.

Further, the first and second bias voltages are applied to the source and the drain of each write-disturbed memory cell, respectively. Therefore, the write disturbance can be effectively reduced regardless of whether that memory cell is on.

DETAILED DESCRIPTION OF THE PREFERRED EMBODIMENTS

FIRST EMBODIMENT

Figure 1:
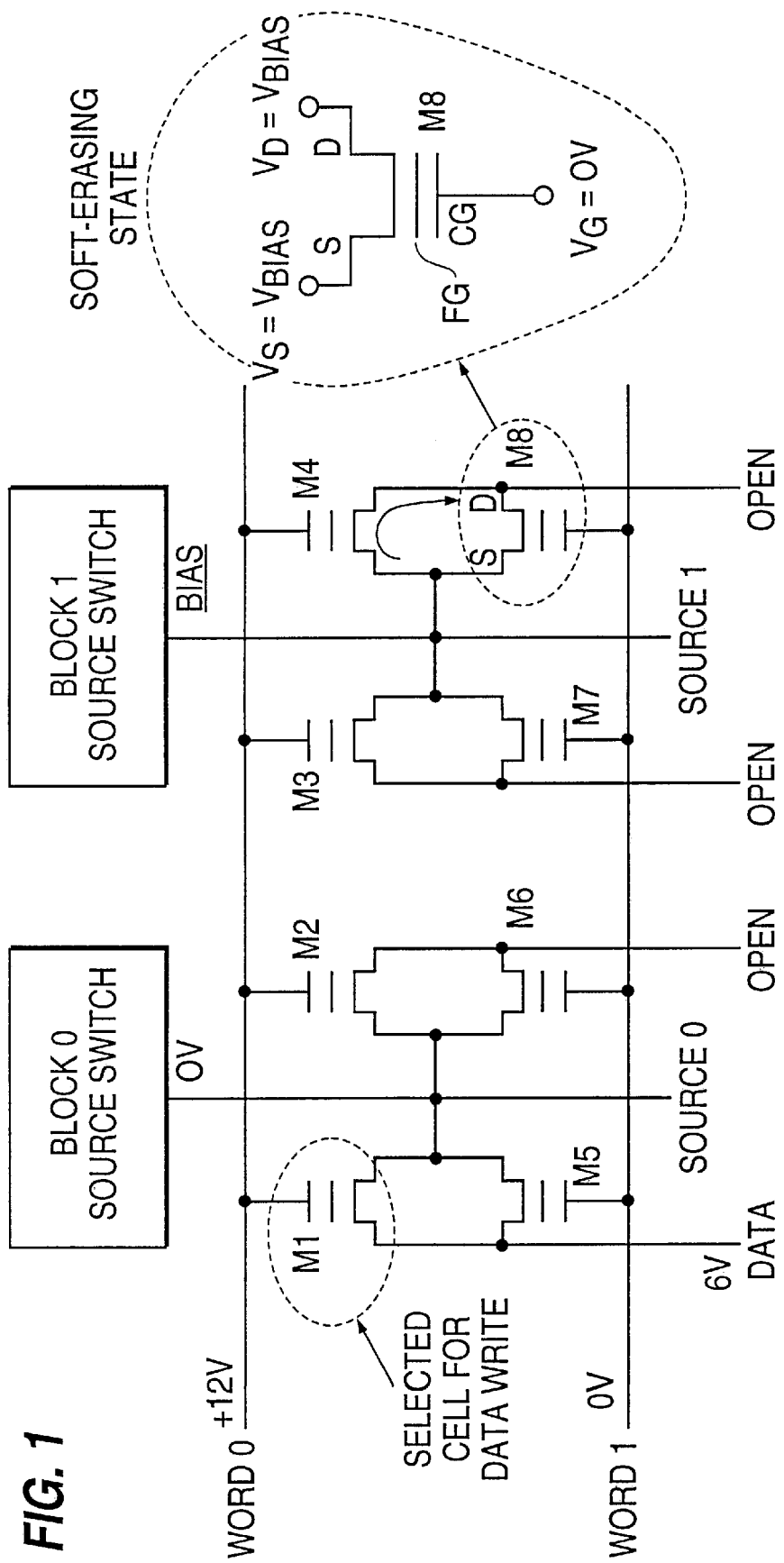
FIG. 1 is a schematic circuit diagram showing a conventional non-volatile memory.
Figure 2:
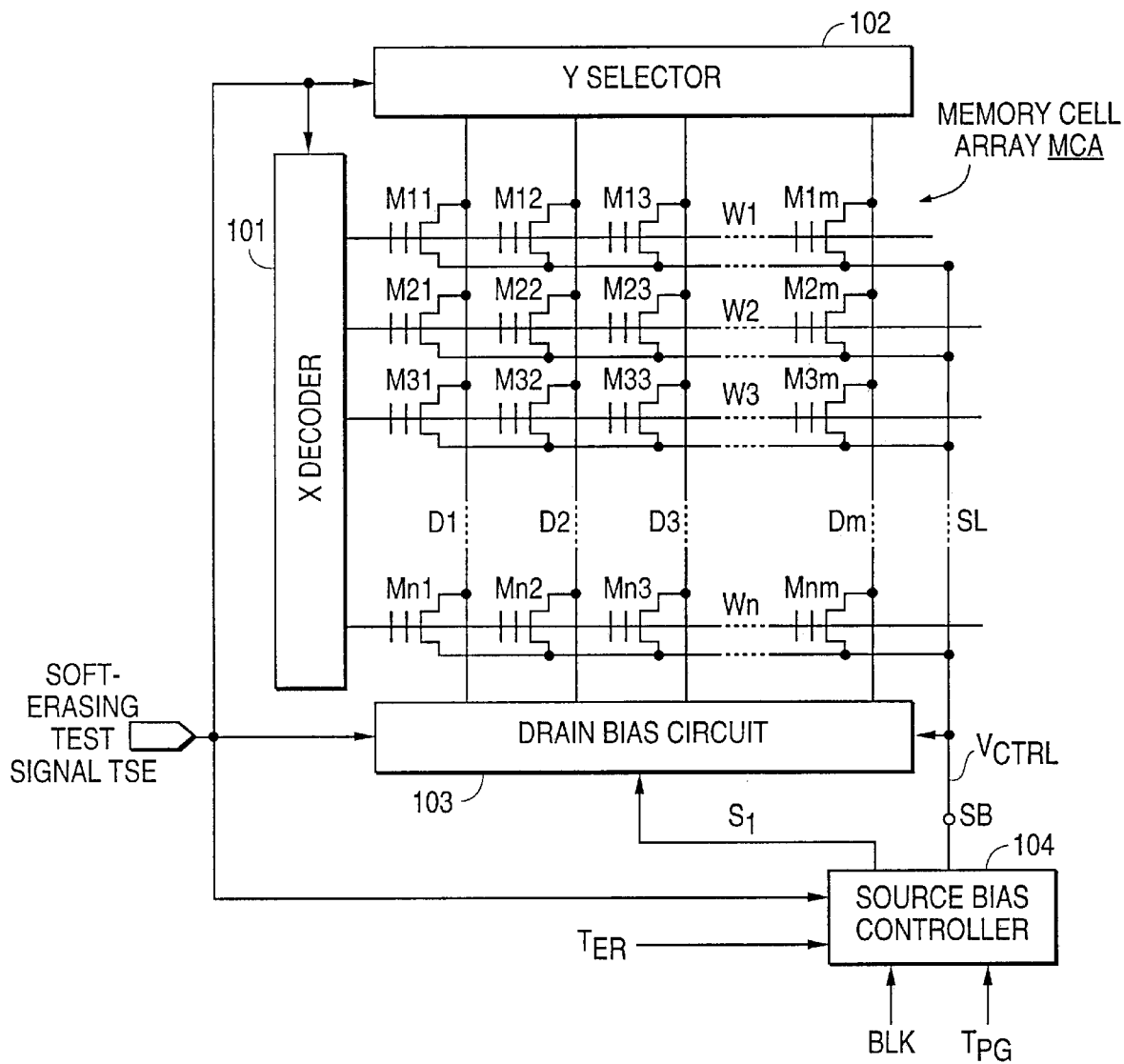
FIG. 2 is a circuit diagram showing a cell array block of a non-volatile memory according to a first embodiment of the present invention.

Referring to FIG. 2, there is shown one of a plurality of cell array blocks included in a non-volatile memory according to a first embodiment of the present invention. Each cell array block has an m by n (m×n) array of mn memory cells, M11–M1m, M21–M2m, ..., and Mn1–Mnm, and each call is provided with a source, a drain, a floating gate and a control gate. Word lines W1–Wn are connected to an X selector 101 which selects one of the word line W1–WN according to address data and further selects all the word lines to ground them according to a soft-erasing test control signal $T_{SE}$. Bit lines D1–Dm are connected to a Y selector 102 which selects one of the bit lines D1–Dm according to address data and further selects all the bit lines D1–DM to set them open according to the soft-erasing test control signal $T_{SE}$. Further the bit lines D1–Dm are connected to a drain bias circuit 103 which applies a control voltage $V_{CTRL}$ on the source bias line SL to all the bit lines D1–Dm according to the soft-erasing test control signal $T_{SE}$. The control gates of memory cells Mil–Mim (i=1, 2, ...,n) for each line are connected in common to the corresponding word line Wi. The drains of memory cells Mlj–Mnj (j=1, 2, ...,m) for each column are connected in common to the corresponding bit line Dj. And the sources of all the memory cello are connected in common to a source bias line SL which is in turn connected to the source bias output terminal SB of a source bias controller 104. The source bias controller 104 applies the control voltage $V_{CTRL}$ to the source bias line SL according to the soft-erasing test control signal $T_{SE}$, an erasing control signal $T_{ER}$, a block selection signal BLK, and a write control signal $T_{PG}$.

Figure 3:
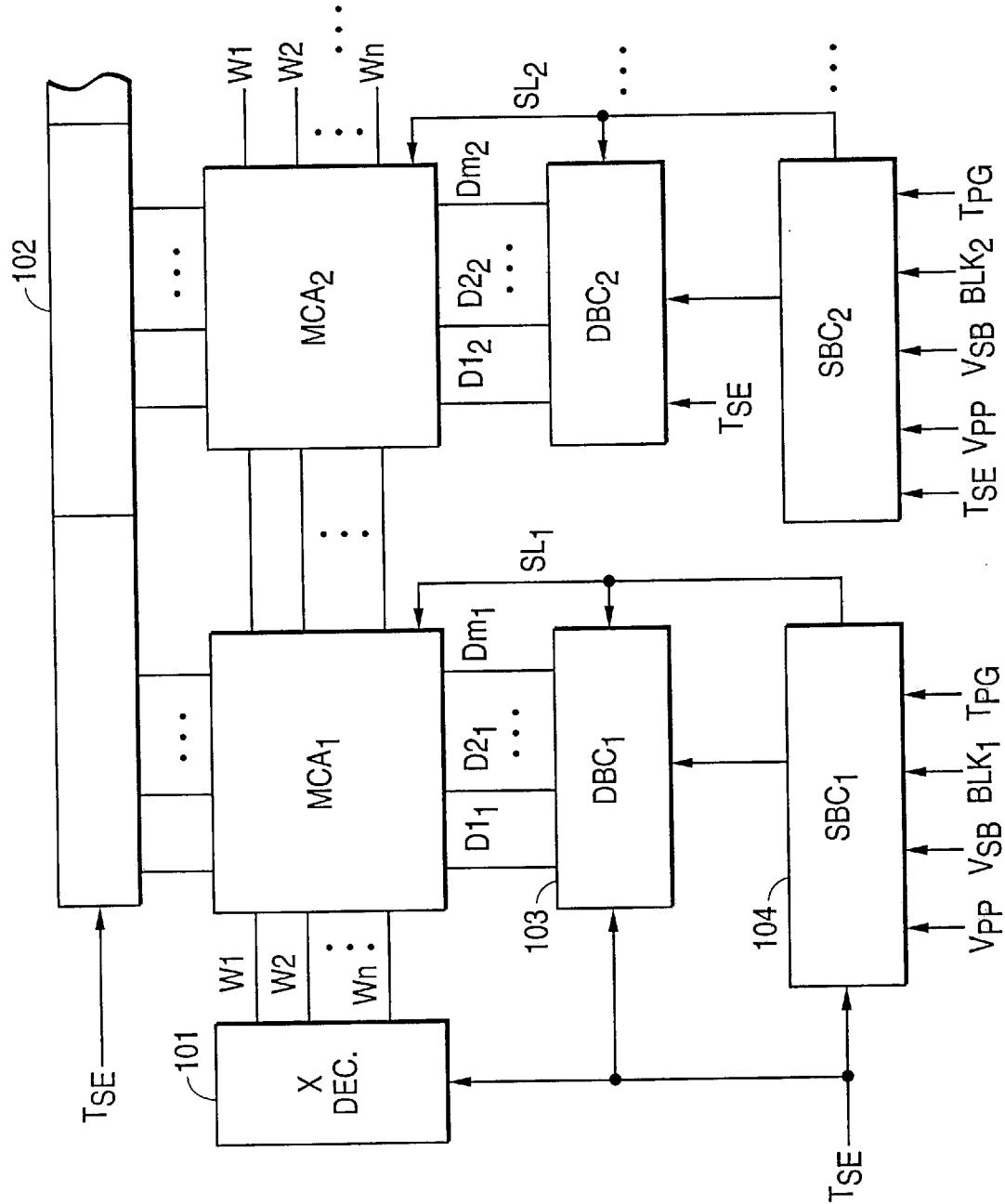
FIG. 3 is a schematic circuit diagram showing the non-volatile memory having a plurality of cell array blocks therein according to the first embodiment of FIG. 2.

As shown in FIG. 3, the non-volatile memory is comprised of a plurality of cell array blocks $MCA_1$, $MCA_2$, ... each having the same circuit configuration as shown in FIG. 2. The word lines W1–Wn of each cell array block are connected in common to the X decoder 101. The bit lines D1–Dm of each cell array block are connected to the Y selector 102 which selects one of all the bit lines according to address data and further selects the bit lines D1–Dm to set them open according to the soft-erasing test control signal $T_{SE}$. Further the bit lines D1–DM of each cell array block are connected to the corresponding drain bias circuit (DBC) 103 and all the sources of each cell array block are connected to the corresponding source bias controller (SBC) 104 through the corresponding source bias line SL. The respective source bias controllers $SBC_1$, $SBC_2$, ..., output appropriate source bias voltages to the cell array blocks $MCA_1$, $MCA_2$, ... through the source bias lines $SL_1$, $SL_2$, ..., according to the soft-erasing test control signal $T_{SE}$, block selection signals $BLK_1$, $BLK_2$, ....

In the non-volatile memory as shown in FIGS. 2 and 3, when receiving the soft-erasing test control signal $T_{SE}$, the source bias controller SBC and the drain bias circuit DBC for each cell array block concurrently apply an appropriate source bias voltage $V_{BIAS}$ to the sources and the drains of all the memory cells included in that cell array block, respectively.

Figure 4:
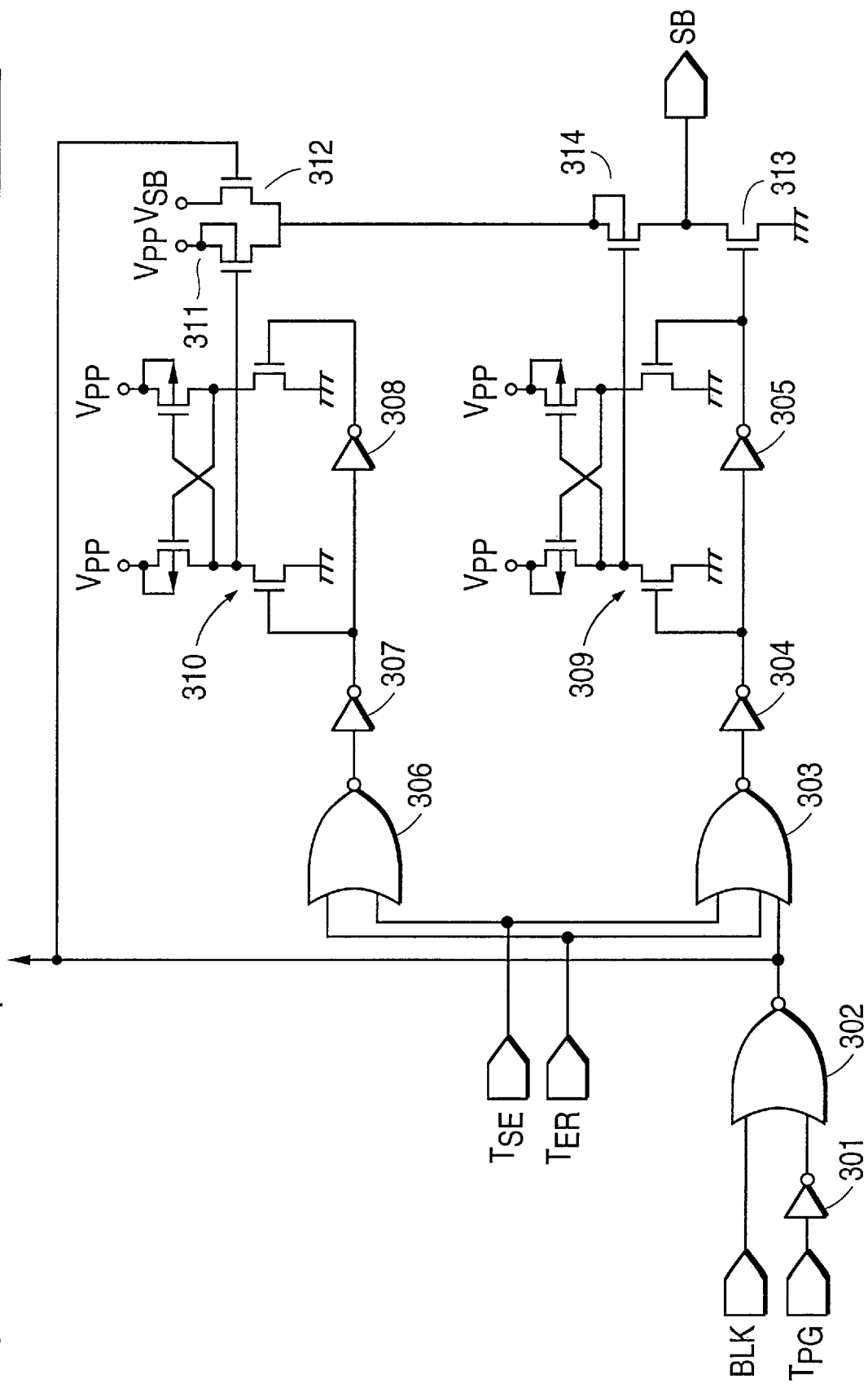
FIG. 4 is a circuit diagram showing a detailed circuit of a source bias controller in the first embodiment of FIG. 2.

Referring to FIG. 4, there is shown an example of the detailed circuit of a source bias controller 104 of FIGS. 2 and 3. The write control signal $T_{PG}$ is received through an inverter 301. A NOR circuit 302 receives the inverted write control signal as well as the block selection signal BLK. A NOR circuit 303 inputs the output of the NOR circuit 302, the soft-erasing test control signal $T_{SE}$, and the erasing control signal $T_{ER}$. The output of the NOR circuit 302 is also output as a control signal $S_1$ to the drain bias circuit 103. The output of the NOR circuit 303 is inverted by an inverter 304 and is further inverted by an inverter 305. The respective outputs of the inverters 304 and 305 are output to a voltage converter 309 and further the output of the inverter 305 is applied to the gate of an N-channel transistor 313.

A NOR circuit 306 inputs the soft-erasing test control signal $T_{SB}$ and the erasing control signal $T_{ER}$. The output of the NOR circuit 306 is inverted by an inverter 307 and is further inverted by an inverter 308. The respective outputs of the inverters 307 and 308 are applied to the input gates of a voltage converter 310. The output of the voltage converter 310 is applied to the gate of a P-channel transistor 311, the source of which receives a voltage $V_{PP}$. An N-channel transistor 312 receives the output of the NOR circuit 302 at its gate and a determined source bias voltage $V_{SB}$ at its source, The drains of the P-channel transistor 311 and the N-channel transistor 312 are connected in common to the source of a P-channel transistor 314. The gate of the P-channel transistor 314 further inputs the output of the voltage converter 309 and its drain is connected to the source bias output terminal SB and the drain of the N-channel transistor 313.

Figure 5:
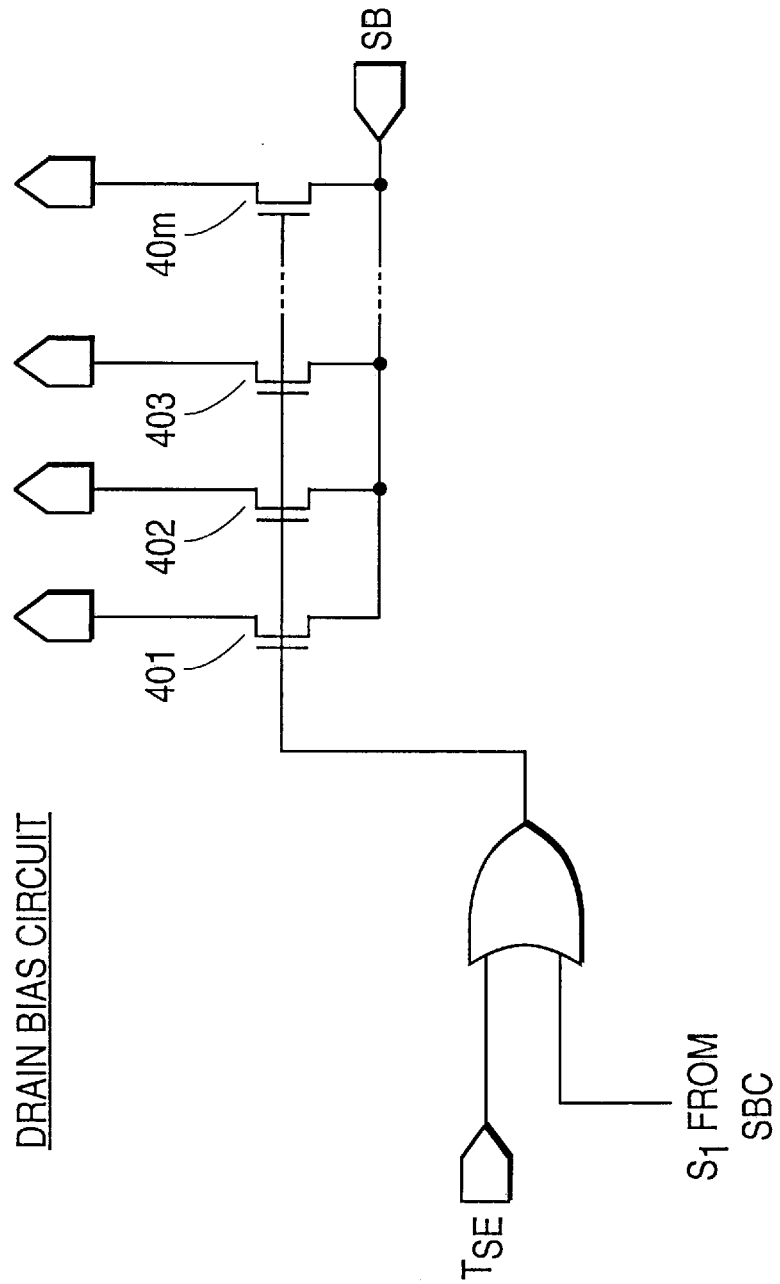
FIG. 5 is a circuit diagram showing a detailed circuit of a drain bias circuit in the first embodiment of FIG. 2.

Referring to FIG. 5, the drain bias circuit 103 is comprised of an OR circuit 400 and a group of N-channel transistors 401–40m. The OR circuit 400 inputs the soft-erasing test control signal $T_{SE}$ and the control signal S1 received from the source bias controller 104, and the ORed output is applied to all the gates of these transistors 401–40m. The sources of the transistors 401–40m are connected in common to the source bias output terminal SB of the source bias controller 104. The respective drains of the transistors 401–40m are connected to the bit lines D1–Dm.

The non-volatile memory having the above circuit as shown in FIGS. 2–5 can concurrently apply an appropriate bias voltage to both the sources and the drains of a cell array block by the drain bias circuit 103 and the source bias controller 104. Therefore, the precise soft-erasing test can be performed to determine the optimal source bias voltage $V_{SB}$ and further the sufficient write-disturbance reduction can be obtained as will be described hereinafter.

SOFT-ERASING TEST OPERATION

When the soft-erasing test is started, an external controller (not shown) sets the soft-erasing test control signal $T_{SE}$ to the high voltage level (here, 5V), the block selection signal BLK, the write control signal $T_{PG}$ and the erasing control signal $T_{ER}$ to the low voltage level. Therefore, that cell array block is not selected.

When the soft-erasing test control signal $T_{SE}$ goes high, the X decoder 101 applies the grounding voltage (0V) to all the word lines W1–Wn and the Y selector 102 sets all the bit lines D1–Dm open, that is, in the non-selected state. Since the write control signal $T_{PG}$ is low, the output of the NOR circuit 302 is also low, resulting in the N-channel transistor 312 being off. Since the soft-erasing test control signal $T_{SE}$ is high, the output of the NOR circuit 303 is low, resulting in the N-channel transistor 313 being off and the P-channel transistor 314 being on. Further, since the output of the NOR circuit 306 is also low, the P-channel transistor 311 is on and the N-channel transistor 312 is off. Therefore, the voltage $V_{PP}$ appears on the source bias output terminal SB and is applied to the source bias line SL connected to the drain bias circuit 103 and the sources of all the memory cells in the cell array block.

Since the soft-erasing test control signal $T_{SE}$ is high, the N-channel transistors 401–40m are on. Therefore, the write/erasing voltage $V_{PP}$ received from the source bias controller 104 is supplied to all the bit lines D1–Dm, so that the voltage $V_{PP}$ is applied to the drains of all the memory cells M11–Mnm.

In such a bias state, the soft-erasing test is performed. In other words, the soft-erasing test is performed in the close-to-actual state that the source bias voltage is applied to both the source and drain of each memory cell, resulting in electric fields generated not only between the control gate and the source but also between the control gate and the drain. Therefore, actual soft-erasing can be precisely duplicated and thereby an optimal source bias voltage $V_{BIAS}$ can be obtained by the soft-erasing test. Especially, since the voltage $V_{PP}$ is variable, the optimal source bias voltage $V_{BIAS}$ can be easily obtained by performing the soft-erasing test while changing the voltage $V_{PP}$. The optimal source bias voltage $V_{BIAS}$ is set as the source bias voltage $V_{EB}$ and a predetermined voltage is set as the write/erase voltage $V_{PP}$ in the non-volatile memory chip.

WRITE DISTURBANCE REDUCTION

Assuming that data is written onto the memory cell M11 of the $MCA_1$ as shown in FIG. 3, the write control signal $T_{PG}$ and the block selection signal $BLK_1$ go high. Therefore, the output of the NOR circuit 302 is low and thereby the N-channel transistor 312 is off. Since both the soft-erasing test control signal $T_{SS}$ and the erasing control signal $T_{ER}$ are low, the output of the NOR circuit 303 is high, resulting in the N-channel transistor 313 being on and the P-channel transistor 314 being off. Therefore, the ground voltage appears on the source bias output terminal SB, and thereby the source bias line SL is set to the ground voltage. In other words, the sources of all the memory cells in the cell array block are grounded. However, since the soft-erasing test control signal $T_{SE}$ is low, the drain bias circuit 103 electrically disconnects the bit lines D1–Dm from the source bias output terminal SB. In this state, the X decoder 101 applies the high voltage to only the word line W1 with grounding other word lines and the Y selector 102 applies a data voltage to only the bit line D1 with other bit lines open.

On the other hand, for another cell array block $MCA_2$ the write control signal $T_{PG}$ goes high and the block selection signal $BLK_2$ go low, that is, this block $MCA_2$ is not selected. Therefore, the output of the NOR circuit 302 is high, resulting in the N-channel transistor 312 being on. Since both the soft-erasing test control signal $T_{SE}$ and the erasing control signal $T_{ER}$ are low, the output of the NOR circuit 306 is high, resulting in the P-channel transistor 311 being off.

Further, since the output of the NOR circuit 303 is low, the P-channel transistor 314 is on and the N-channel transistor 313 is of E. Therefore, the source bias voltage $V_{SB}$ which has been optimally determined by the soft-erasing test appears on the source bias output terminal SB. In other words, the source bias voltage $V_{SB}$ is applied to the sources and the drains of all the memory cells in the non-selected cell array block $MCA_2$. Since the source bias voltage $V_{SB}$ is applied to both the source and drain of each memory cell, the write disturbance can be effectively reduced regardless of whether each memory cell is on.

In the case of erasing operation, the erasing control signal $T_{ER}$ goes high. Therefore, the P-channel transistors 311 and 314 are on and the N-channel transistors 312 and 313 are off, resulting in the erasing voltage $V_{PP}$ appearing on the source bias output terminal SB.

SECOND EMBODIMENT

Figure 6:
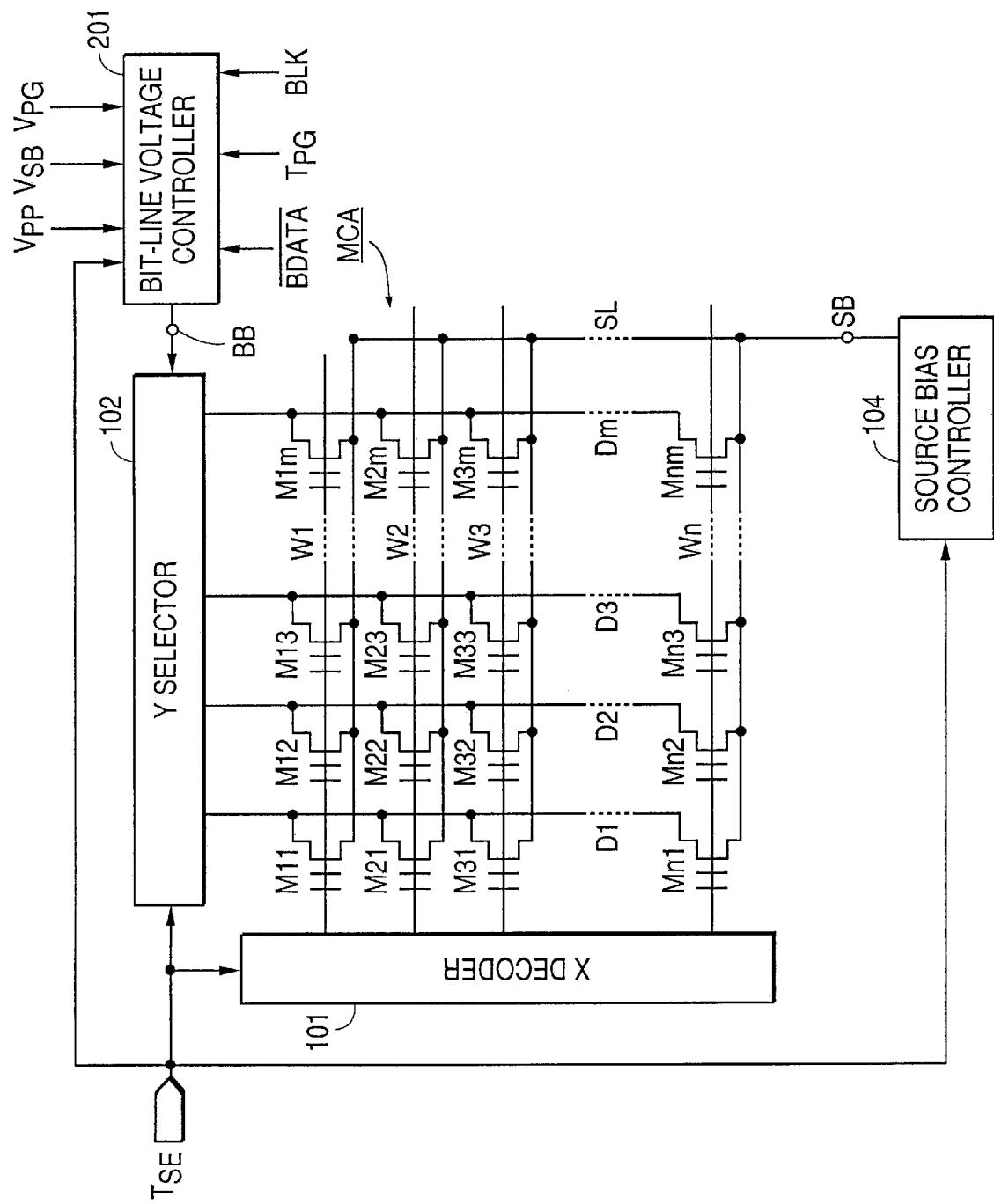
FIG. 6 is a circuit diagram showing a cell array block of a non-volatile memory according to a second embodiment of the present invention.

Referring to FIG. 6, there is shown ore of a plurality of cell array blocks included in a non-volatile memory according to a second embodiment of the present invention, where circuit elements similar to those previously described with reference to FIG. 2 are denoted by the same reference numerals and their descriptions are omitted. In this embodiment, the non-volatile memory is provided with a bit-line voltage controller 201 for each cell array block. The bit-line voltage controller 201 outputs a controlled bit line voltage to the Y selector 102 which applies the controlled bit line voltage to a selected bit line or all bit lines.

Figure 7:
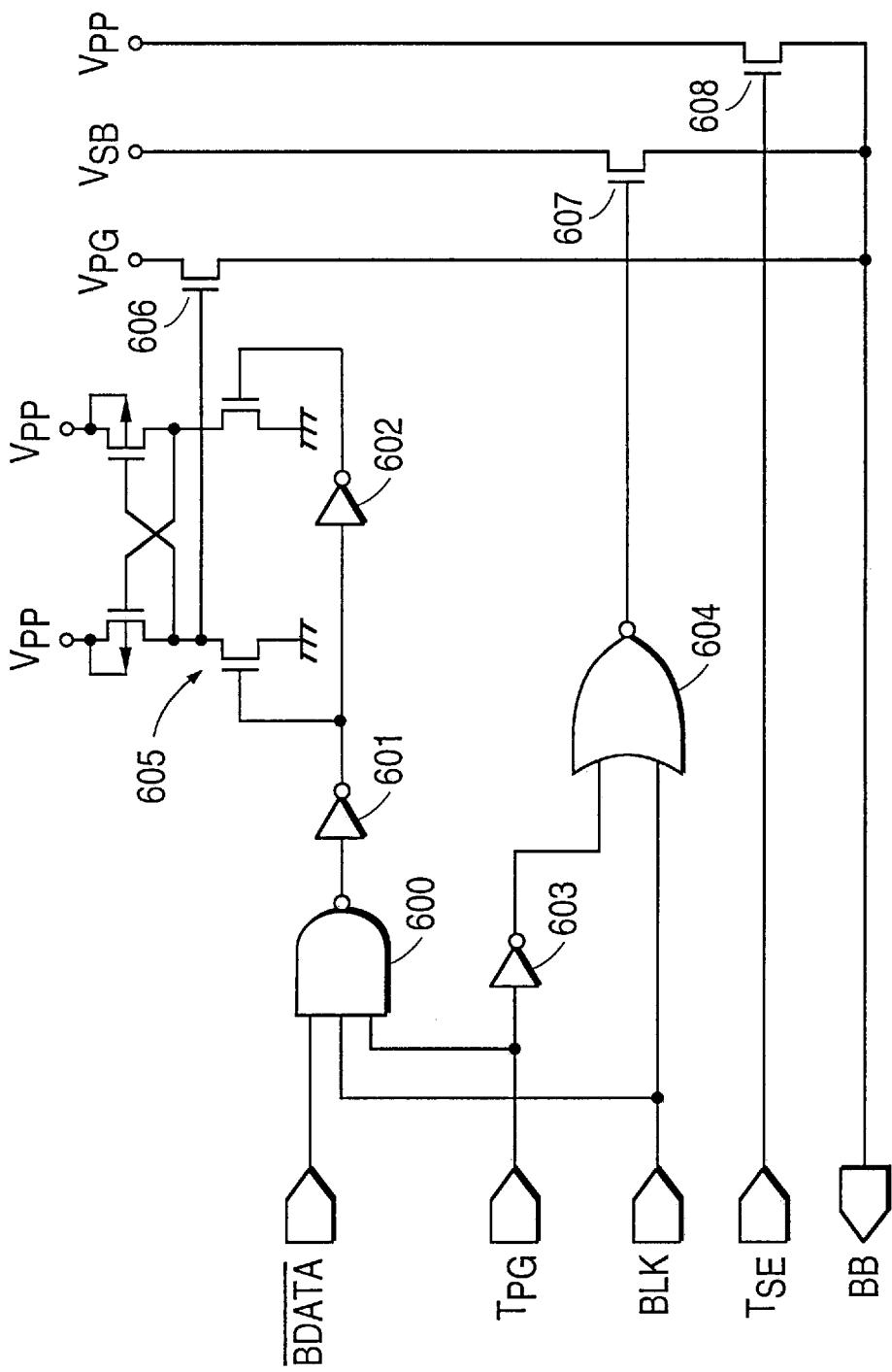
FIG. 7 is a circuit diagram showing a detailed circuit of a bias circuit in the second embodiment of FIG. 6.

Referring to FIG. 7, there is shown an example of the detailed circuit of the bit-line voltage controller 201 of FIG. 6. The inverted data BDATA which is inverted write data, the write control signal $T_{PG}$ and the block selection signal BLK are input to an NAND circuit 600 and the output of the NAND circuit 600 is inverted by an inverter 601 and is further inverted by an inverter 602. The respective outputs of the inverters 601 and 602 are output to the input gates of a voltage converter 605. The write control signal $T_{PG}$ is inverted by an inverter 603 and then input to an NOR circuit 604 which also inputs the block selection signal BLK.

The output of the voltage converter 605 is applied to the gate of an N-channel transistor 606 which receives a write drain voltage $V_{PG}$ at its source. The output of the NOR circuit 604 is applied to the gate of an N-channel transistor 607 which receives a source bias voltage $V_{SB}$ at its source. And, the soft-erasing test control signal $T_{SE}$ is applied to the gate of an N-channel transistor 608 which receives a write/erasing voltage $V_{FF}$ at its source. The drains of the N-channel transistors 606–608 are connected to a bit-line voltage output terminal BB.

SOFT-ERASING TEST OPERATION

When the soft-erasing test is started, an external controller (not shown) sets the soft-erasing test control signal $T_{SE}$ to the high voltage level (here, 5V), the block selection signal BLK and the write control signal $T_{PG}$ to the low voltage level, and the inverted data BDATA is high.

When the soft-erasing test control signal $T_{SE}$ goes high, the X decoder 101 applies the ground voltage (0V) to all the word lines W1–Wn and the Y selector 102 selects all the bit lines D1–Dm. Since the write control signal $T_{PG}$ is low, the output of the NOR circuit 604 is also low, resulting in the N-channel transistor 607 being off. Since the inverted data BDATA is high, the output of the NAND circuit 600 is high, resulting in the N-channel transistor 606 being off. Since the soft-erasing test control signal $T_{SE}$ is high, the N-channel transistor 608 is on. Therefore, the voltage $V_{PP}$ appears on the bit-line voltage output terminal BB and is applied to the drains of all the memory cells through the Y selector 102.

As described before, the source bias controller 104 outputs the voltage $V_{PP}$ to the source bias output terminal SB and is applied to the source bias line SL connected to the sources of all the memory cells in the cell array block. Therefore, the soft-erasing test is performed in the close-to-actual state that the source bias voltage is applied to both the source and drain of each memory cell, resulting in electric fields generated not only between the control gate and the source but also between the control gate and the drain. In other words, the second embodiment can obtain the similar advantages to the first embodiment as shown in FIGS. 2–5.

WRITE DISTURBANCE REDUCTION

Assuming that data '0' is written onto the memory cell M11 of the $MCA_1$ as shown in FIG. 3, the write control signal $T_{PG}$ and the block selection signal $BLK_1$ go high. Therefore, the output of the NOR circuit 604 is low and thereby the N-channel transistor 607 is off and further the output of the NAND circuit 600 is low, resulting in the N-channel transistor 606 being on. Therefore, the write control signal $T_{PG}$ appears on the bit-line voltage output terminal BB and is applied to the selected bit line D1. As described before, the source bias controller 104 outputs the ground voltage to the source bias output terminal SB, and thereby the source bias line SL is set to the ground voltage. In other words, the sources of all the memory cells in the cell array block are grounded. And the X decoder 101 applies the high voltage to only the word line W1 with grounding other word lines and thereby the data is written onto the memory cell M11.

On the other hand, for another cell array block $MCA_2$, the write control signal $T_{PG}$ goes high and the block selection signal $BLK_2$ go low, that is, this block $MCA_2$ is not selected. Therefore, the output of the NOR circuit 604 is high, resulting in the N-channel transistor 607 being on and further the output of the NAND circuit 600 is high, resulting in the N-channel transistor 606 being off. Since the soft-erasing test control signal $T_{SE}$ is low, the N-channel transistor 608 is also off. Therefore, the source bias voltage $V_{SB}$ which has been optimally determined by the soft-erasing test appears on the bit-line voltage output terminal BB. In other words, the source bias voltage $V_{SB}$ is applied to the sources and the drains of all the memory cells in the non-selected cell array block $MCA_2$. Since the source bias voltage $V_{SB}$ is applied to both the source and drain of each memory cell, the write disturbance can be effectively reduced regardless of whether each memory cell is on.

What is claimed is:

1. A non-volatile memory comprising:
a plurality of cell blocks each comprising a plurality of non-volatile memory cells which are electrically rewritable, each non-volatile memory cell comprising a source, a drain, a control gate and a floating gate; and
a bias controller for concurrently applying a first bias voltage to the source and a second bias voltage to the drain of each non-volatile memory cell in cell blocks.

2. The non-volatile memory according to claim 1, wherein the bias controller concurrently applies the first bias voltage to both the source and the drain of each non-volatile memory cell.

3. The non-volatile memory according to claim 1, wherein, in each cell block, the sources of the non-volatile memory cells are connected to a source bias line and the drains are connected in groups to bit lines, respectively.

4. The non-volatile memory according to claim 3, wherein the bias controller comprises:
a source bias controller for applying the first bias voltage to the source bias line; and
a drain bias controller for applying the second bias voltage to the bit lines when the first bias voltage is applied to the source bias line.

5. A non-volatile memory comprising:
a plurality of cell blocks each comprising a plurality of nonvolatile memory cells which are electrically rewritable, each non-volatile memory cell comprising a source, a drain, a control gate and a floating gate, the sources of the non-volatile memory cells being connected to a source bias line, the drains being connected in columns to bit lines, respectively, the control gates being connected in rows to word lines, respectively, and the word lines being shared between a plurality of cell blocks;
a word line controller for controlling a voltage of each of the word lines;
a bit line controller for controlling a voltage of each of the bit lines; and
a bias controller for concurrently applying a first bias voltage to the source bias line and a second bias voltage to the bit lines in cell blocks.

6. The non-volatile memory according to claim 5, wherein the bias controller comprises:
a source bias controller for applying the first bias voltage to the source bias line; and
a drain bias controller for applying the second bias voltage to the bit lines when the first bias voltage is applied to the source bias line.

7. The non-volatile memory according to claim 6, wherein the drain bias controller comprises a plurality of switches connected to the bit lines, respectively, the switches transferring the first bias voltage to the bit lines when the first bias voltage is applied to the source bias line.

8. The non-volatile memory according to claim 6, wherein the drain bias controller outputs the first bias voltage to the bit line controller and the bit line controller applies the first bias voltage to the bit lines when the first bias voltage is applied to the source bias line.

9. A method for controlling a non-volatile memory comprising a plurality of cell blocks each comprising a plurality of non-volatile memory cells which are electrically rewritable, each non-volatile memory cell comprising a source, a drain, a control gate and a floating gate, the sources of the non-volatile memory cells being connected to a source bias line, the drains being connected in columns to bit lines, respectively, the control gates being connected in rows to word lines, respectively, and the word lines being shared between the cell blocks, the method comprising the steps of:
selecting a cell block from the cell blocks to write data onto a non-volatile memory cell in a selected cell block;
applying a first bias voltage to the source bias line of each of cell blocks other than the selected cell block; and
applying a second bias voltage to the bit lines of each of the cell blocks other than the selected cell block when the first bias voltage is applied to the source bias line.

10. The method according to claim 9, wherein the first bias voltage is concurrently applied to both the source bias line and the bit lines drain of each cell block.

11. The method according to claim 9, wherein the first bias voltage is determined by soft-erasing test which is performed in such a bias state that a variable bias voltage is applied to both the source bias line and the bit lines drain of each cell block.

12. The non-volatile memory according to claim 1, wherein the first bias voltage is determined by soft-erasing test which is performed in such a bias state that a variable bias voltage is applied to both the source and the drain of each non-volatile memory cell in a cell block.

13. The non-volatile memory according to claim 5, wherein the first bias voltage is determined by soft-erasing test which is performed in such a bias state that a variable bias voltage is applied to both the source bias line and the bit lines drain of each cell block.

* * * * *